TEMPERATURE COMPENSATED CRYSTAL OSCILLATORS

Filed June 12, 1968 3 Sheets-Sheet 1

United States Patent Office 3,531,739
Patented Sept. 29, 1970

3,531,739

TEMPERATURE COMPENSATED CRYSTAL OSCILLATORS

Charles M. Groves, Ilford, England, assignor to The Plessey Company Limited, Ilford, England, a British company Filed June 12, 1968, Ser. No. 736,466
Claims priority, application Great Britain, June 15, 1967, 27,632/67
Int. Cl. H03b 5/36
U.S. Cl. 331—116 7 Claims

ABSTRACT OF THE DISCLOSURE

A circuit arrangement for affording temperature compensation of crystal controlled oscillator comprises a temperature sensor including a semiconductor device having a known voltage/temperature characteristic and a voltage function generator which receives the output from the temperature sensor and comprises a number of transistor stages having voltage/temperature characteristics matching the slope at different points on a full compensating characteristic and means for combining the voltage outputs from the transistor stages to provide the full compensating voltage characteristic which is applied to the variable capacitance diode of the crystal controlled oscillator.

This invention relates to arrangements for the temperature compensation of crystal oscillators.

As is well-known, the frequency of crystal oscillators varies with temperature change to provide a frequency/temperature characteristic having both negative and positive slopes over a temperature range of say from —40° C. to +60° C. Hitherto compensation for changes in frequency with temperature over the aforesaid range has been afforded by a network of thermistors having different temperature/voltage characteristics which co-operate to provide a voltage output conveniently fed to a capacitance diode in the crystal circuit to correct for the frequency changes in the crystal. Since, on the one hand, crystal frequency/temperature characteristics are very much individual to the crystal, and on the other hand, thermistor resistance and slope tolerances are relatively large, and also having regard to the fact that the thermistors of the network are inter-dependent in operation, that is to say they significantly affect the operating mode of each other, it becomes extremely difficult and laborious to match such thermistor combinations to crystals for temperature compensation purposes.

The present invention has in view a circuit arrangement for affording temperature compensation as aforesaid of crystal controlled oscillators, comprising a temperature sensor including a semiconductor device having a known voltage/temperature characteristic and a voltage function generator which receives the output from the temperature sensor and comprises a number of transistor stages having voltage/temperature characteristics matching the slope at different points on a full compensating characteristic and means for combining the voltage outputs from said stages to provide said full compensating voltage characteristic which may be applied to a variable capacitance diode in the crystal circuit.

In carrying out the invention the temperature sensor may comprise two transistors having respective positive and negative voltage/temperature characteristics. These transistors preferably have linear voltage/temperature characteristics but provided that the characteristic is known linearity is not essential. These transistors will be arranged to feed their voltage outputs to respective groups of transistor stages of the function voltage generator appertaining, respectively, to negative and positive slopes of the full compensating characteristic to be provided.

The different parts of the slopes of the full compensating characteristic may be combined by means of a common load resistor associated with groups of transistor stages.

For the purpose of providing generally horizontal parts of the characteristic joining positive and negative slopes of the full compensating characteristic, voltage clamping arrangements, for example potential dividers, are provided which determine the horizontal position or the amplitude of the function generated by the function generator.

The present invention also provides a specific temperature sensor comprising a pair of complementary transistors having linear voltage/temperature characteristics but with opposite temperature coefficients, with the bases of the transistors being interconnected via a potential divider network and the circuit providing two voltage outputs for feeding to the bases of transistor stages of a function generator as set forth above.

By way of example one embodiment of the present invention will now be described with reference to the accompanying drawings, in which.

Figure 1:
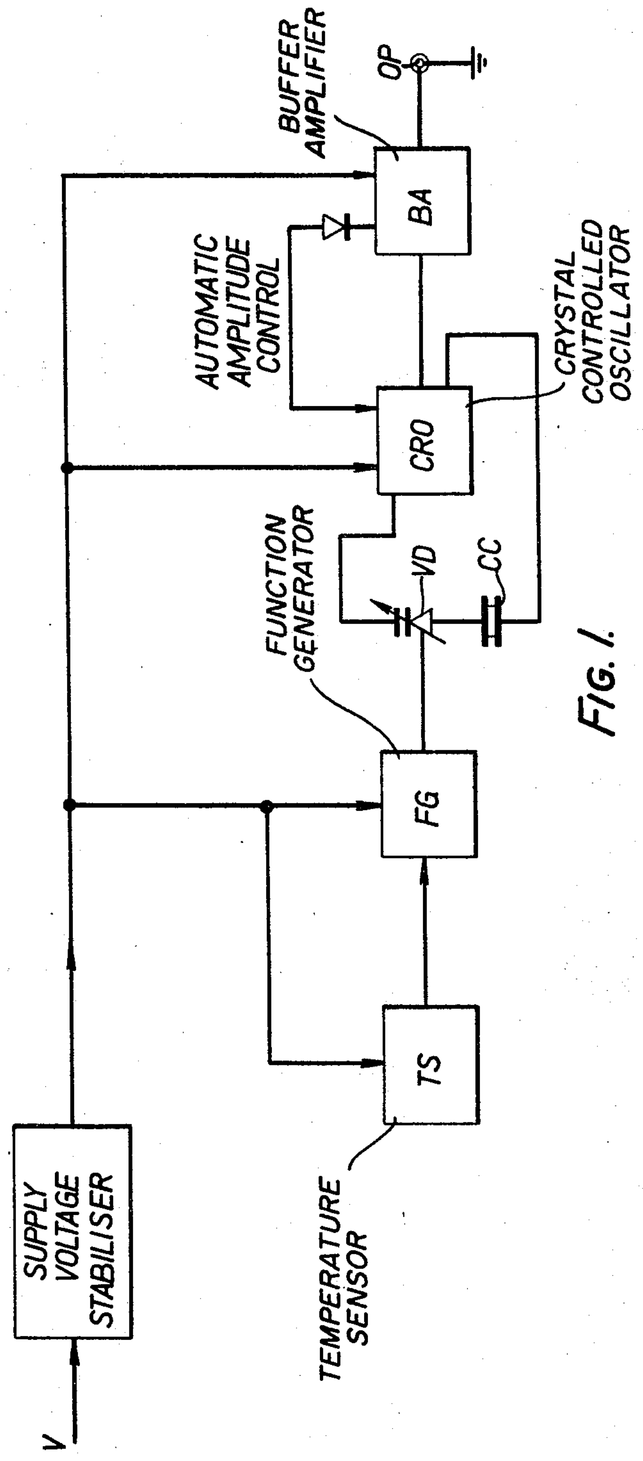
FIG. 1 is a block diagram of a temperature compensated crystal controlled oscillator arrangement.

Referring to FIG. 1 of the drawing a crystal controlled oscillator CRO has a varicap diode VD connected in series with the controlling crystal CC. As is well known, the frequency of oscillation of the crystal CC will vary with temperature and a typical frequency/temperature characteristic of the crystal would be the inverse of the characteristic shown in FIG. 3 of the accompanying drawing. The present invention provides a temperature compensating arrangement by which a controlling voltage having a voltage/temperature characteristic which is the inverse of the frequency/temperature characteristic of the crystal is applied to the anode of the varicap diode VD to vary the capacitance thereof and thereby maintain the frequency of the oscillator output constant in the face of temperature changes. The output from the oscillator CRO is fed via a buffer amplifier BA to an output terminal OP.

For the purpose of providing the varicap diode VD control voltage which compensates for changes in frequency with temperature of the crystal CC the present invention provides a temperature sensor TS which provides an output voltage dependent upon temperature. This output voltage is then passed to a function generator FG which generates from such voltage a further voltage the amplitude of which varies with temperature in a manner inversely related to the variation of frequency with temperature of the crystal CC. Such a voltage/temperature characteristic is shown in FIG. 3 of the drawings.

Figure 2:
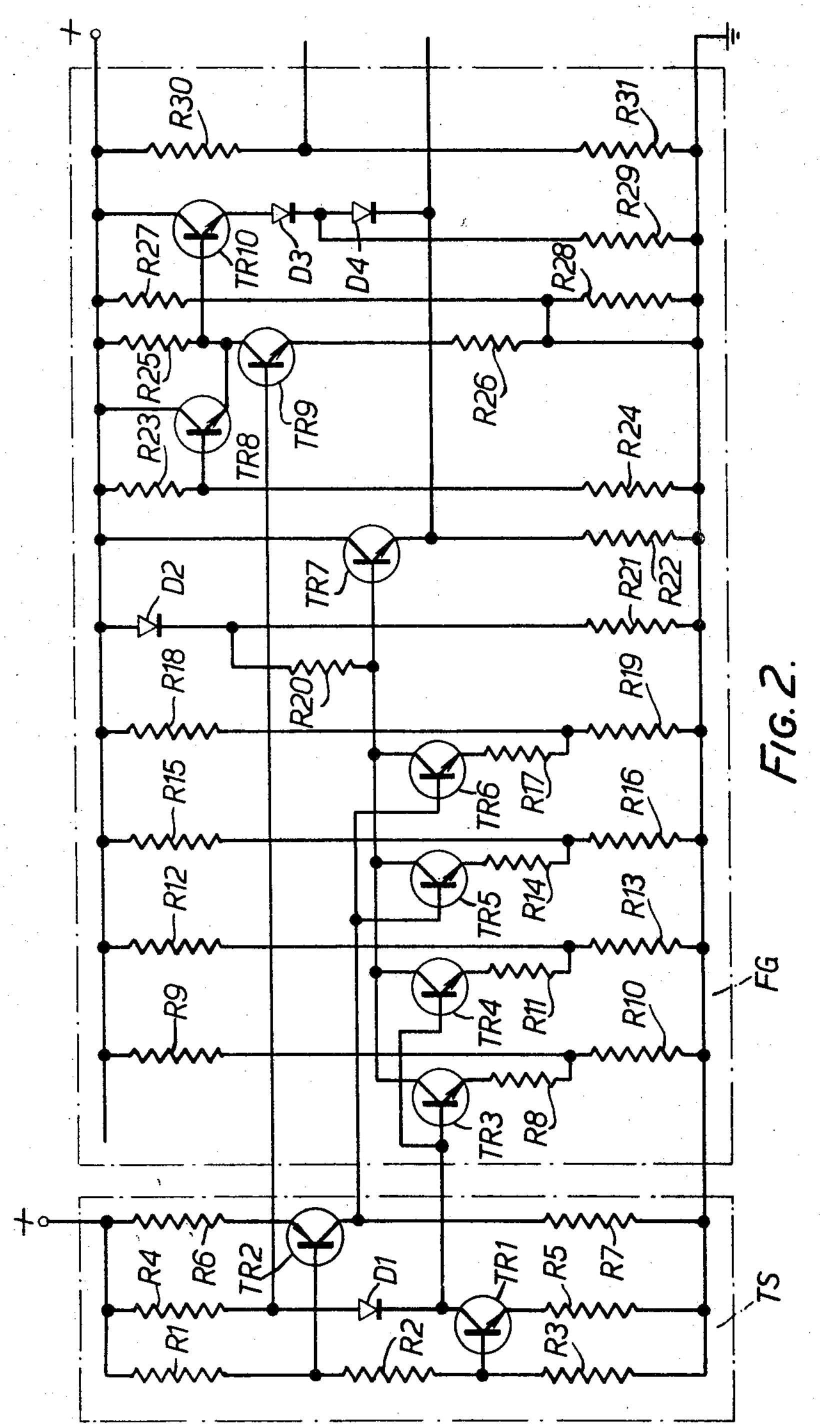
FIG. 2 is a circuit diagram of the temperature sensor and voltage function generator of FIG. 1.
Figure 3:
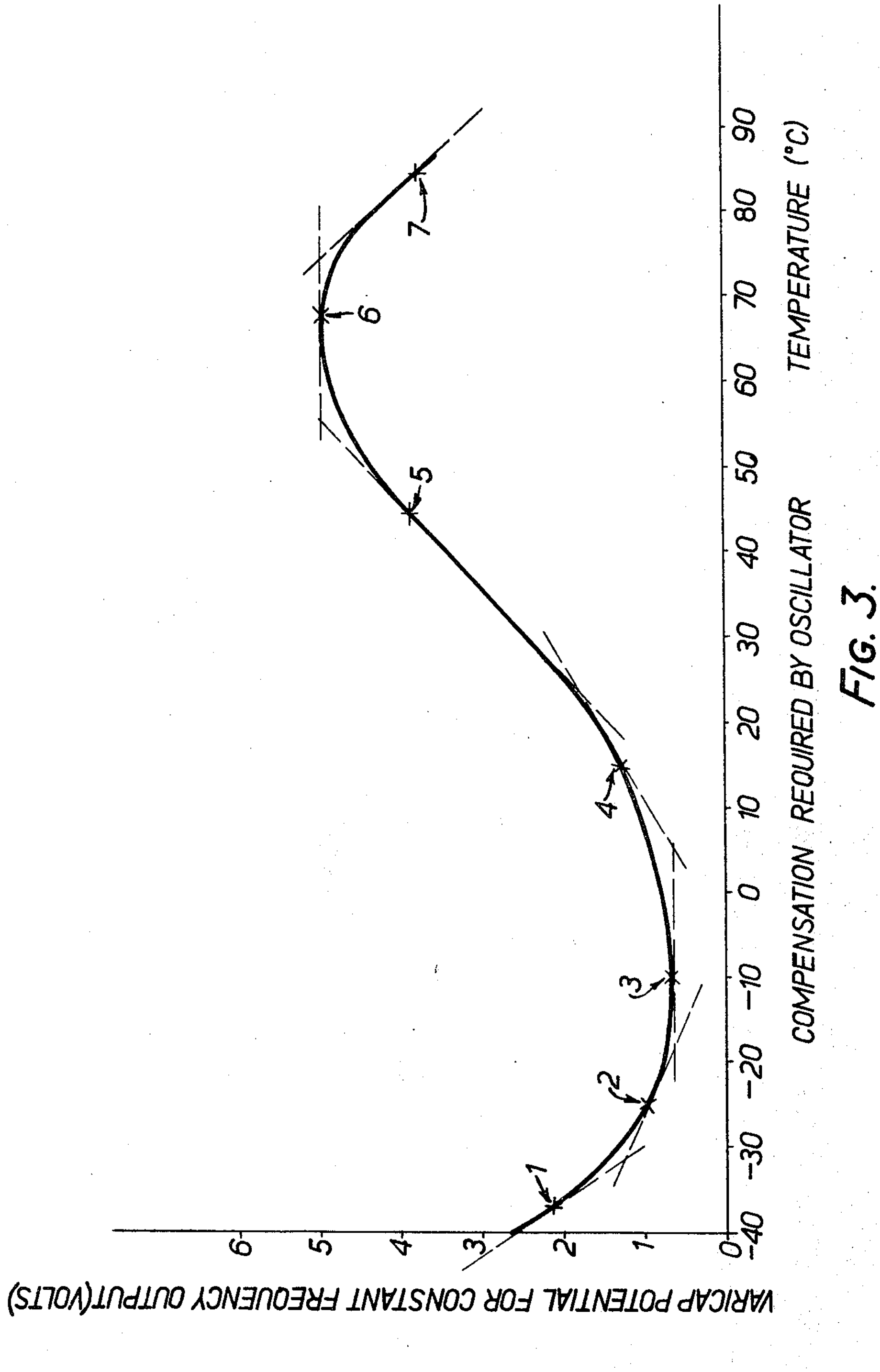
FIG. 3 is a diagram showing the voltage/temperature characteristic required to be applied to the varicap diode of the oscillator circuit of FIG. 1 to correct for variation of frequency and temperature.

Referring now to FIG. 3, it will be observed that the characteristics shown which extend over a temperature range of —40° C. to 85° C. can be derived approximately by interconnecting seven lines L1 to L7. Of these lines the lines L1, L2 and L7 have negative slopes or coefficients, the lines L4 and L5 have positive slopes while the lines L3 and L6 have zero slope. The individual points 1 to 7 where the lines L1 to L7 coincide with the voltage temperature characteristic will be called thermal tracking points. It is convenient now to refer to FIG. 2 to understand how the slopes or lines L1 to L7 are produced.

The temperature sensor TS comprises a pair of complementary transistors TR1 and TR2 which have negative and positive temperature coefficients, respectively. Both of these transistors have linear voltage/temperature characteristics. The base potentials of the transistors TR1 and TR2 are determined by the potential divider comprising resistors R1, R2 and R3 while the collector potentials of the transistors which are applied to slope generating transistor stages to be described later are dependent upon the resistance values of the resistor R4 and the resistance of diode D1 in the case of transistor TR1 and the resistance of resistor R7 in case of transistor TR2.

The transistor TR1 is arranged to feed the bases of two slope-generating transistors TR3 and TR4 which are arranged to produce the negative coefficient slope L1 and L2. The other negative coefficient slope L7 is generated by a transistor TR9 also fed from the transistor TR1. The transistor TR2 feeds the bases of two further slope-producing transistors TR5 and TR6 which generate the positive coefficient slopes L4 and L5. The ratio of the resistance values of the resistors R4 and R5, and R5 and R7 may be ten say so that the base emitter voltage of the transistors TR1 and TR2 is amplified ten times producing say an output temperature coefficient of 17 millivolts/° C. at the collectors.

The slope-generating transistors TR3 and TR6 have a common load resistor R20 and it is the ratio of the ohmic value of this resistor to that of the emitter resistors R8, R11, R14 and R17 of the transistors TR3 and TR6 that determines the slope of the outputs from the transistors TR3 to TR6. The thermal tracking points of the slopes 1, 2, 4 and 5 can be adjusted by the displacement of the slopes L1, L2, L4 and L5 by appropriate selection of the ratio between the ohmic values of resistors R9 and R10, R12 and R13, R15 and R16, and R18 and R19.

In the case of the slope L7 this will be determined by suitable choice of the ratio between the ohmic values of resistors R25 and R26 while the tracking point 7 will be determined by the ratio between the resistances of resistors R27 and R28.

In operation of the arrangement the transistors TR3 to TR6 and TR9 will be selectively rendered conductive according to the ambient temperature. As the temperature changes through the range from −40° C. to 85° C. the transistors will conduct in turn and non-linearity of the transistors at "turn-on" may be utilised to provide a non-linear transition between adjacent slopes as for example between the slopes 6 and 7 and 2 and 3.

As far as slopes L1 to L6 are concerned the common load resistor R20 connects the slopes generated by transistors TR3 to TR6 and the output from the latter is arranged to be fed through an emitter follower transistor TR7 to the anode of the varicap diode VD to effect a variation in its capacitance to maintain the frequency output of the oscillator constant. The transistor TR9 generates the slope L7 and the output from this transistor is fed separately via an emitter follower transistor TR10 to the varicap diode VD so as to isolate the slopes 1 and 2 and 4 from the slope 7.

The zero temperature coefficient slopes 3 and 6 which determine the amplitude of the function generated are afforded by voltage clamping arrangements by selection of the resistances of resistors R30 and R24 respectively, with the value of the resistor R30 determining the potential applied to the varicap cathode and the value of resistor R24 determining the base potential of the transistor TR8.

The diodes D1 to D4 act as direct voltage level shifts so that the maximum voltage swing required to be accommodated with the supply voltage (e.g. 8.5 volts). The temperature coefficients of these diodes are of little significance as they are placed in the high level parts of the circuit.

From the foregoing it will be appreciated that the transistor stages of the temperature compensating arrangement according to the invention can be adjusted to suit the particular crystal concerned without affecting the performance of the other stages and thus an operation can be performed on one part of the compensating voltage/temperature characteristic without affecting other parts of the characteristic as has heretofore been one of the main drawbacks of the thermistor network arrangement. Moreover, the temperature sensor and function generator circuits lend themselves well to the use of integrated circuit and thin-film techniques.

What I claim is:

1. A circuit arrangement for affording temperature compensation of crystal controlled oscillators, comprising a temperature sensor including two transistors having respective positive and negative voltage/temperature characteristics, and a voltage function generator which receives the output from the temperature sensor and comprises a plurality of slope-generating transistors which are arranged to conduct in turn in response to variation in output from said sensor with temperature change to provide output voltages matching the slope at different points on a full compensating characteristic and means for combining the voltage outputs from said transistor to provide said full compensated voltage characteristic for application to the crystal circuit.

2. A circuit arrangement for affording temperature compensation as claimed in claim 1, in which the said two transistors have linear voltage/temperature characteristics.

3. A circuit arrangement for temperature compensation as claimed in claim 1, in which the said two transistors are arranged to feed their voltage outputs to respective groups of transistor stages of the function voltage generator appertaining, respectively, to negative and positive slopes of the full compensating characteristic.

4. A circuit arrangement for temperature compensation as claimed in claim 1, in which voltages corresponding to different parts of the slopes of the full compensating characteristic are combined by means of a common load resistor associated with groups of transistor stages.

5. A circuit arrangement for temperature compensation as claimed in claim 1, in which for the purpose of providing generally horizontal parts of the characteristic joining positive and negative slopes of the full compensating characteristic voltage clamping arrangements are provided which determine the horizotnal position or the amplitude of the function generated by the function generator.

6. A circuit arrangement for temperature compensation as claimed in claim 5, in which the voltage clamping arrangements comprise potential dividers.

7. A crystal controlled oscillator comprising an oscillator circuit including a crystal and a variable capacitance diode in series with said crystal, and a temperature compensating circuit arrangement as claimed in claim 1 in which the full compensated voltage characteristic is applied to the variable capacitance diode.

References Cited

UNITED STATES PATENTS

| | | | |
|---|---|---|---|
| 3,397,367 | 8/1968 | Steel et al. | 331—176 |
| 3,404,297 | 10/1968 | Fewings et al. | 331—116 |

JOHN KOMINSKI, Primary Examiner

U.S. Cl. X.R.

331—176; 334—15